US006905578B1

(12) United States Patent
Moslehi et al.

(10) Patent No.: US 6,905,578 B1
(45) Date of Patent: *Jun. 14, 2005

(54) APPARATUS AND METHOD FOR MULTI-TARGET PHYSICAL-VAPOR DEPOSITION OF A MULTI-LAYER MATERIAL STRUCTURE

(75) Inventors: Mehrdad M. Moslehi, Los Altos, CA (US); Cecil J. Davis, Greenville, TX (US); Christopher J. Mann, Danville, CA (US); Dwain R. Jakubik, Palmer, TX (US); Ajit P. Paranjpe, Sunnyvale, CA (US)

(73) Assignee: CVC Products, Inc., Rochester, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/067,143

(22) Filed: Apr. 27, 1998

(51) Int. Cl.[7] .......................... C23C 14/34; C23C 16/00
(52) U.S. Cl. ............................. 204/192.12; 204/192.11; 204/192.13; 204/192.2; 204/298.03; 204/298.04; 204/298.09; 204/298.11; 204/298.15; 204/298.16; 204/298.23; 204/298.25; 204/298.26; 204/298.27; 204/298.28; 204/298.29; 118/719; 118/723 VE
(58) Field of Search .................. 204/192.11, 192.12, 204/192.13, 192.2, 298.03, 298.04, 298.07, 298.08, 298.09, 298.11, 298.15, 298.23, 298.25, 298.26, 298.27, 298.28, 298.29, 298.12, 298.16; 118/719, 723 R, 723 VE

(56) References Cited

U.S. PATENT DOCUMENTS 4,051,010 A * 9/1977 Roth et al. .............. 204/298.07
4,315,960 A * 2/1982 Ohji et al. ............. 204/298.11
4,410,407 A * 10/1983 Macaulay ............... 204/298.26
4,647,361 A * 3/1987 Bauer ..................... 204/298.09
4,675,096 A * 6/1987 Tateishi et al. ......... 204/298.25
4,894,132 A * 1/1990 Tanaka ................... 204/192.13
4,938,858 A * 7/1990 Zejda ..................... 204/298.25
5,024,747 A * 6/1991 Turner et al. ........... 204/298.09
5,076,205 A * 12/1991 Vowles et al. .............. 118/719
5,205,919 A * 4/1993 Zejda ..................... 204/298.15
5,241,152 A * 8/1993 Anderson et al. ....... 204/298.08
5,365,772 A * 11/1994 Ueda et al. ............. 204/298.03
5,433,812 A * 7/1995 Cuomo et al. .......... 204/298.11
5,490,912 A * 2/1996 Warner et al. .......... 204/298.02
5,595,814 A * 1/1997 Yamagata et al. .......... 428/216
5,630,916 A * 5/1997 Gerrish et al. .......... 204/298.16
5,665,214 A * 9/1997 Iturralde ................ 204/298.03
5,783,055 A * 7/1998 Kamei et al. ........... 204/298.23

* cited by examiner

Primary Examiner—Rodney G. McDonald
(74) Attorney, Agent, or Firm—Baker Botts L.L.P.

(57) ABSTRACT

An apparatus and method for depositing plural layers of materials on a substrate within a single vacuum chamber allows high-throughput deposition of structures such as these for GMR and MRAM application. An indexing mechanism aligns a substrate with each of plural targets according to the sequence of the layers in the structure. Each target deposits material using a static physical-vapor deposition technique. A shutter can be interposed between a target and a substrate to block the deposition process for improved deposition control. The shutter can also preclean a target or the substrate and can also be used for mechanical chopping of the deposition process. In alternative embodiments, plural substrates may be aligned sequentially with plural targets to allow simultaneous deposition of plural structures within the single vacuum chamber. A monitoring and control device can be wed to optimize equipment state, process state, and wafer state parameters by sensing each respective state during or after the deposition process.

95 Claims, 4 Drawing Sheets

APPARATUS AND METHOD FOR MULTI-TARGET PHYSICAL-VAPOR DEPOSITION OF A MULTI-LAYER MATERIAL STRUCTURE

TECHNICAL FIELD OF THE INVENTION

This invention relates in general to the field of fabrication of semiconductor integrated circuits and data storage devices, and more particularly to an improved multi-target physical-vapor deposition apparatus and method of use for controlled deposition of a multi-layer material structure onto a substrate in an ultra clean vacuum processing environment.

BACKGROUND OF THE INVENTION

Several important applications, including spin-valve giant magneto-resistive (GMR) thin-film heads and semiconductor integrated circuits, use multi-layer material stacks to perform various electronic signal processing and data storage functions. For instance, semiconductor integrated circuit (IC) applications often include multi-layer interconnect structures comprised of multiple layers of glue/diffusion barrier, interconnect metal, and anti-reflection coating (ARC) films. For instance, some multi-level interconnect structures in semiconductor ICs employ a multi-layer conductive material stack comprising titanium, titanium nitride, aluminum (doped with copper), and a top titanium nitride ARC layer in each interconnect level. Another application that uses multi-layer material structures is magnetic data storage thin-film head devices. For instance, giant magneto-resistive (GMR) thin-film head and magnetic random access memory (MRAM) spin-valve tunnel junction devices use multi-layer material structures comprising stacks of conductive, magnetic, and/or insulating material layers as thin as 10 to 30 Å.

Conventional magnetic data storage devices use thin film heads comprised of inductive and/or magneto-resistive (MR) materials. MR heads enable higher magnetic storage densities compared to the storage densities of devices having inductive heads due to the higher read sensitivity and signal-to-noise ratio of MR senors. The MR heads read the stored information with direct magnetic flux sensing and are, thus, capable of static read-back without dependency on the relative motion (e.g., disk rotation speed) of the magnetic media compared to the head. The MR heads operate based on a resistance change of an MR element (permalloy) in response to the magnetic flux on the media. Both the inductive and MR thin-film heads employ inductive writer elements.

Industry transition from inductive heads to MR heads for magnetic data storage systems has allowed rapid technology evolution in terms of maximum storage density (described in Gbits/in$^2$ and system storage capacities. Industry has increased storage density of magnetic is storage systems at a historical rate of 30% per year and a current annual rate of 60%. Leading edge state-of-the-art rigid disk storage media now have storage densities on the order of 2 to 5 Gbits/in$^2$ (gigabits per square inch), with industry projecting storage densities approaching 10 Gbits/in$^2$ by the turn of the century. As the recording densities transition from 2 Gbits/in$^2$ towards 5 Gbits/in$^2$, industry will have to replace the MR head technology with more sensitive devices, such as spin-valve GMR heads. Eventually, to maintain present trends toward improved storage capacities, industry may transition form GMR materials to colossal magneto-resistive (CMR) materials, which could support storage densities approaching 100 Gbits/in$^2$.

In 1987, the giant magneto-resistive or GMR effect was discovered. GMR materials, usually consisting of at least two ferromagnetic nanostructure entities separated by a nonmagnetic spacer, display a change of resistance upon the application of a magnetic field. GMR materials have a larger relative resistance change and have increased field sensitivity as compared against traditional anisotropic magneto-resistive or MR materials, such as $Ni_{80}Fe_{20}$ films. The improved relative resistance change and field sensitivity of GMR materials and related magnetic sensing elements allow the production of sensors having greater sensitivity and signal-to-noise ratio than conventional sensors. Thus, for instance, data storage systems using GMR read sensors can store greater amounts of data in smaller disk areas as compared to conventional data storage devices. However, material stacks for fabricating GMR sensors generally use 6 to 8 layers of 4 to 6 different materials, as compared to the MR material stacks, which usually have only 3 layers of materials such as in permalloy layers with Soft Adjacent Layers (SAL). Thus, creating material stacks for GMR read sensors generally required more processing steps, including more complicated equipment and fabrication techniques for high-yield manufacturing of high-performance GMR thin-film heads.

In order to meet its goals for improved storage density, industry will likely turn to spin-valve GMR thin-film heads. Spin-valve GMR heads are comprised of multi-layer depositions of 10 to 100 angstrom thick material films having precise thickness and microstructure control as well as extremely cohesive interface control at each interface of a multi-layer spin-valve GMR stack. Each spin-valve GMR stack must have good crystalinity in conjunction with abrupt and smooth material interfaces with minimal interface mixing to ensure proper GMR response and to establish excellent thermal stability. For instance, FIG. 1 depicts one possible spin-valve GMR configuration. The precision required for spin-valve stack deposition can be understood by comparing the 1.5 nanometer thick layer of cobalt in FIG. 1 against a typical atomic radius of 0.2 nanometers (corresponding to approximately 7 atomic layers). Essentially, GMR stacks may require controlled deposition of metallic multilayers which comprise ultrathin films as thin as 5 to 10 atomic nanolayers.

Another application for GMR materials is magnetic random access memories ("MRAM"), which are monolithic silicon-based nonvolatile memory devices presently based on a hysteretic effect in magneto-resistive or MR materials. MRAM devices are typically used in aerospace and military applications due to their excellent nonvolatile memory bit retention and radiation hardness behavior. Moreover, the MRAM devices can be easily integrated with silicon integrated circuits for embedded memory applications. The implementation of GMR materials, such as spin-dependent tunnel junctions, could improve the electrical performance of MRAM devices to make MRAM devices competitive with semiconductor DRAM and flash EPROM memory devices. However, the performance of MRAM memory depends on precise control of layer thickness values and the microstructures of various thin films in a GMR stack of thin metallic films. Thickness fluctuations and other interface or microstructural variations in thin metallic layers can cause variation in MRAM device performance. Similar difficulties can occur with periodic laminated multi-layer structures, such as laminated flux guide structures of iron, tantalum and silicon di-oxide.

The precision-controlled deposition of materials onto a substrate to create the multi-layer structures that can use the GMR effect is a difficult and time consuming process which requires high-performance vacuum deposition equipment, including plasma sputtering, ion-beam and evaporation processes. Although conventional physical-vapor deposition (PVD) technology can create GMR-capable structures, each layer of a structure must be carefully deposited in sequence in a time-consuming sequential series of depositions, a complicated process having a relatively slow throughput. Typically, such conventional PVD technology dynamically rotates a substrate at rapid speeds relative to a target in an attempt to evenly distribute the material being deposited onto the substrate. However, dynamic deposition requires a relatively large process chamber relative to the size of the target and the size of the substrate in order to allow rotation of the substrate. The PVD systems with dynamic rotation also complicate integration of advanced chucks and/or magnetic orientation devices for substrate processing applications. Further, dynamic deposition is inefficient because the target deposits material onto the substrate only when the rotation of the substrate aligns it partially or fully with the target. Material deposited from the target during non-alignment periods is wasted. Also, precise control of layer thickness and interface characteristics cannot be ensured with dynamic deposition, particularly when targets are changed after each dynamic deposition process or substrates are moved is to modules with new targets, thus, allowing impurities to be introduced between deposition layers. Such impurities frequently cause material structures to fail.

SUMMARY OF THE INVENTION

Therefore, a need has arisen for an apparatus and method which can precisely and controllably deposit multi-layer stacks of materials comprising conductive, magnetic, and insulating layers with precision thickness control, excellent uniformity, and coherent ultraclean interfaces.

A further need exists for an apparatus and method for depositing multilayer stacks of metallic, magnetic, and/or insulating materials in an efficient manner with an economic fabrication throughput for volume production applications.

A further need exists for an apparatus and method for depositing multilayer stacks of metallic, magnetic, and/or insulating materials without introducing impurities or contaminants to the layers and at the material stack interfaces by minimizing the presence of contaminants during a deposition process, and by minimizing the duration of substrate exposure to contamination sources during processing.

A further need exists for an apparatus and method that allows real-time monitoring during a multi-step deposition process to directly control multilayer stack film thickness values as well as microstructural and interface/surface properties during the deposition process.

In accordance with the present invention, an apparatus and method for depositing multiple layers of thin conductive, insulating, and/or magnetic films is provided that substantially eliminates or reduces disadvantages and problems associated with previously developed deposition systems and processes (such as the prior art plasma sputtering and ion beam deposition systems). Plural targets sequentially deposit material onto a substrate. The targets and substrate are disposed within the same vacuum chamber with ultraclean vacuum base pressure. Each target can comprise a material associated with one layer or several layers of a desired multi-layer structure. The targets can sequentially deposit materials according to a predetermined sequence corresponding to the multi-layer structure, such as a sequence that will create a multi-layer structure for spin-valve GMR thin-film heads or tunneling-junction MRAM devices. A substrate support can align the substrate with the targets in a predetermined sequence. Upon alignment with a target, a power source or process energy source associated with the targets initiates physical-vapor deposition of the material onto the substrate for a duration determined and controlled by a process timer or by a real-time in-situ sensor.

More specifically, in one embodiment, the substrate support is sequentially aligned with each of plural targets by an indexing mechanism operating on a substrate chuck assembly. For instance, the targets can be arranged in a circular configuration within a target plane (e.g., vacuum chamber lid) in the vacuum chamber, and an indexing chuck disposed in the vacuum chamber can rotate the substrate-chuck or support mechanism to each target (for instance, to align the central axes of the target and the substrate), the rotation occurring in a substrate plane that is preferably substantially parallel to the target plane. After the substrate aligns with each target, a power source or process energy source (such as DC magnetron, RF magnetron, or RF diode, or a pulsed magnetron energy source) associated with the targets and the substrate can deposit material from each target to the substrate by using preferably static physical-vapor deposition. Via an indexing operation, the indexing chuck can move the substrate to various target positions after a deposition time expires for each respective target, the process or deposition time corresponding to the precise thickness of the layer being deposited and other deposition process parameters. The sequential indexing mechanism cooperates with the targets to align the substrate under each target according to the predetermined order of materials in the multi-layer structure or stack. The indexing mechanism can include a sensing device to ensure proper alignment of the substrate below each respective target (for instance, using a home position sensor on the chuck indexing drive mechanism).

In another embodiment of the present invention, plural targets are arranged along the top lid of a physical-vapor deposition (PVD) vacuum chamber to sputter down onto the substrate. A substrate wafer is placed on the substrate support (for instance, a processing chuck) of an indexing chuck to face up at the targets. A substrate can be inserted into the vacuum process chamber through an access valve between the vacuum process chamber and a vacuum handling chamber. The access valve can be closed and the vacuum chamber evacuated with a vacuum pump such as a cryo pump and a water pump to achieve a very low base pressure and to reduce the contaminants present during the physical-vapor deposition sputtering process. The chuck can then align the wafer underneath a first PVD target comprised of a first material. A stepper motor associated with the chuck drive or indexing mechanism can provide precise alignment of the wafer and the target. A DC or RF power source (or alternatively, a pulsed DC or pulsed RF source) can apply either continuous wave or pulsed electrical energy within the vacuum or low-pressure gas medium between the target and the substrate to perform physical-vapor deposition on the substrate using DC magnetron or RF magnetron or RF diode physical-vapor deposition techniques. Upon completion of deposition of the first material by the first target, the chuck indexing drive mechanism can move the indexing chuck to align with a second desired target comprised of a second material according to the predetermined sequence corresponding to the multi-layer structure. The chuck can move the substrate between the first and second or other targets until the desired multi-layer structure has been deposited wherein all layers are deposited in the predetermined sequence, within a single vacuum processing chamber. It is also possible to place another type of processing energy source (e.g., a high-density inductively-coupled plasma or ICP source for soft plasma cleaning applications) in place of any of the process positions (or target positions) within the multi-station indexing-chuck process.

In another embodiment of the present invention, a shutter mechanism interposed between a target and the substrate can enhance the processing flexibility and the precision of the physical-vapor deposition process by enabling in-situ pre-cleaning of a target or a substrate. The shutter mechanism comprises an electrically or pneumatically operated shutter, which can be a stainless steel or a titanium metal plate, that is light weight and thin enough to be interposed between the target and the chuck. Power applied to the target can initiate and stabilize a sputtering process (for instance, for initial target cleaning and burn-in), after which the shutter plate can be removed from between the target and the chuck to allow precise control of the sputtering process and deposited film thickness, including the length of time deposition occurs. After a predetermined time corresponding to a desired deposition thickness has elapsed (or when a real-time in-situ thickness sensor determines the process end-point time), the shutter plate can again be reinserted between the target and the substrate to terminate the sputtering process. In one embodiment, the shutter plate cooperates with a rotating shield to reduce contamination during the sputtering process.

In another embodiment, electrical chopping can replace the shutter for controlling deposition time intervals. A plasma filament can ignite plasma when the target is aligned with the substrate. The instantaneous ignition of the plasma over the substrate is accomplished through a localized discharge which can provide an evenly distributed sputtered material layer onto the substrate. Power can be distributed to the target in pulses of varying length and intensity to provide time for atoms to diffuse over the deposition surface (pulsed deposition).

In another embodiment, the deposition process can be monitored and controlled on a real-time or post-deposition basis by using associated real-time in-situ and in-line in-vacuo sensors and closed loop controllers. Vacuum-integrated sensors and related controllers can cooperate with the indexing mechanism to provide greatly improved deposition control for a wide range of material thickness values. Sensors can be located within or associated with the vacuum chamber for real-time in-situ measurements, or in a dedicated vacuum metrology module attached to the vacuum chamber for pre-process and post-process in-line measurements. Sensors can monitor substrate, process or equipment state parameters to provide optimal material layer thickness, uniformity, microstructure and/or interface control. For instance, sensors can measure the wafer-state parameters such as the thickness of individual films (e.g., ellipsometry), the sheet resistance of individuals films and stacks, and the composition and thickness of individual films and stacks (e.g., x-ray fluorescence), as well as equipment and process considerations such as plasma source current and voltage, optical emissions for estimating instantaneous deposition rates, vacuum pressure measurements, wafer temperature measurements, as well as magnetic flux uniformity and skew on the chuck surface. These measurements can support closed loop monitoring and control of the equipment and process states to achieve predetermined process state and/or substrate state parameters.

The present invention provides important technical advantages by allowing precise production of multi-layer material structures such as spin-valve GMR and MRAM material systems. One important technical advantage is the use of the indexing chuck to allow independent and rapid movement of a substrate among plural targets located in the same vacuum processing environment. Multiple layers of materials can be deposited on a substrate in a single vacuum chamber with ultraclean vacuum base pressure, thus, limiting the contaminants which could otherwise be introduced by changing targets during the deposition process, or by transporting the substrate to multiple vacuum processing chambers.

Another technical advantage of the present invention is precise control over film thickness for any of the films in a multi-layer stack which allows deposition of thin layers to fabricate various high-performance device structures including spin-valve GMR, tunneling MRAM, and semiconductor interconnect material systems. The shutter mechanism can provide precise control of stabilized deposition time for each PVD target resulting in improved uniformity for each deposition layer. Moreover, it allows effective in-situ cleaning of the substrate and/or the PVD targets.

Another important technical advantage is provided by the electrical chopping process energy source which supports deposition of multiple layers with minimal moving parts. Further, by altering the pulse intensity and frequency, improved diffusion of target atoms can be accomplished over the substrate surface.

Another important technical advantage of the present invention is provided by both in-situ and in-vacuo pre- and post-deposition measurements of material layers and process/equipment parameters to allow precision control of process and equipment parameters for achieving precise layer characteristics.

BRIEF DESCRIPTION OF THE DRAWINGS

A more complete understanding of the present invention and advantages thereof may be acquired by referring to the following description taken in conjunction with the accompanying drawings in which like reference numbers indicate like features and wherein.

DETAILED DESCRIPTION OF THE INVENTION

Preferred embodiments of the present invention are illustrated in the figures, like numerals being used to refer to like and corresponding parts of the various drawings.

Physical-vapor deposition or PVD is a well-known technique for depositing thin layers of materials onto a substrate for a variety of semiconductor, data storage, optoelectronics, and other applications. Plasma sputtering or plasma PVD is the most widely accepted PVD technique for deposition of various material layers. A power source, such as a DC magnetron or RF magnetron or an RF diode power source, creates power differential between a target assembly comprising the cathode and an anode ring in order to produce a plasma medium between the target and the substrate within a controlled vacuum environment. This electrical power creates a gas discharge plasma and produces ion bombardment on the target surface (e.g., via argon ions), resulting in sputtering of the target material and sputter deposition of the target material onto the substrate. CVC sells physical-vapor deposition tools, such as the CONNEXION® cluster tool, which can support vacuum-integrated physical-vapor deposition of magnetic and non-magnetic as well as electrically conductive and insulating films. The CVC cluster platform can deposit multiple layers of different materials by attaching a physical-vapor deposition module to the cluster platform for each material to be deposited, and then cycling the substrate through each module. However, each process module has a cost associated with it, making the deposition of multiple different material layers expensive using this approach. Also, the process of transferring wafers to and from each module can slow production (due to the wafer handling overhead time) and introduce impurities by repeated exposure of the substrates to the wafer handling vacuum chamber.

Figure 2:
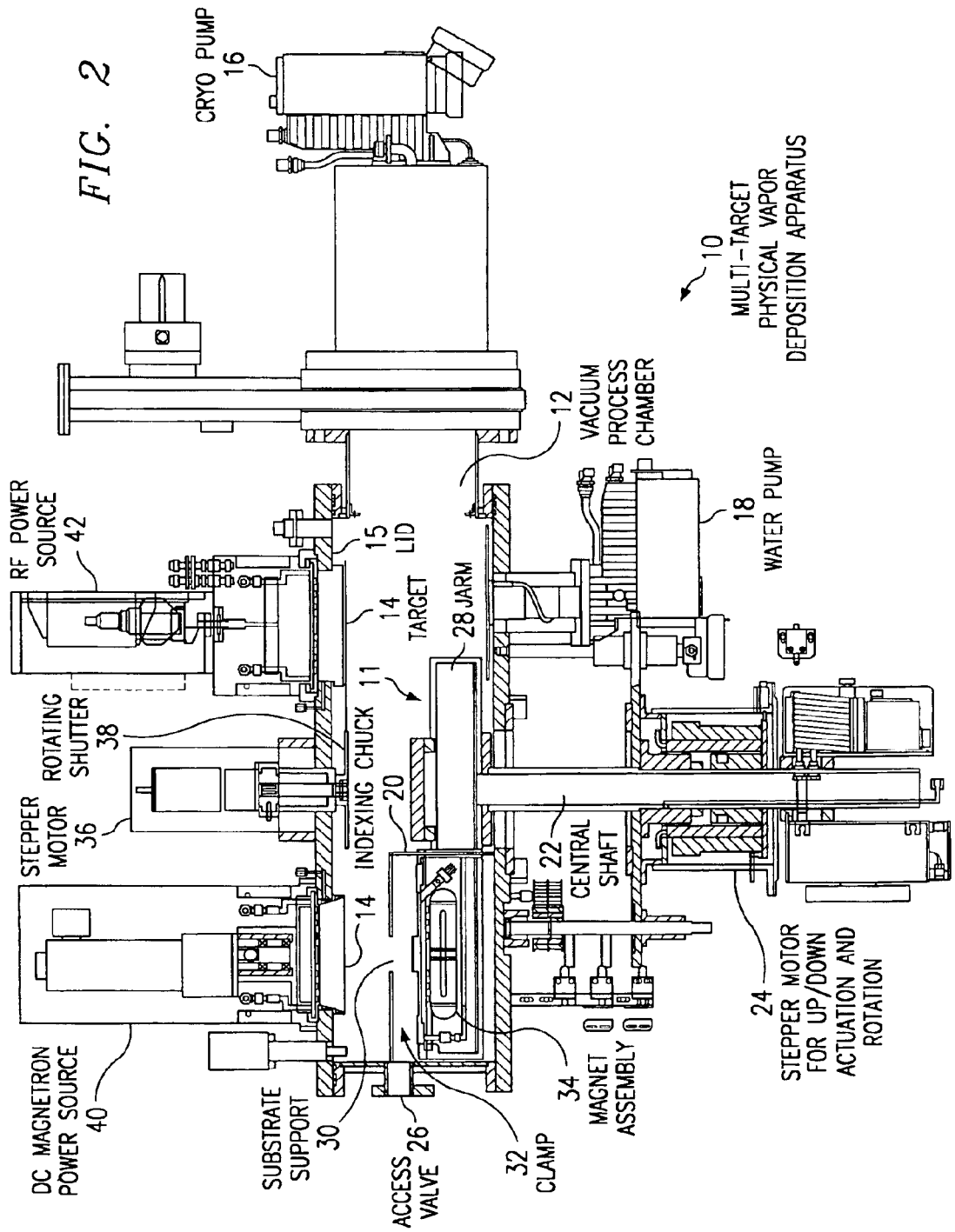
FIG. 2 depicts a side view of a multi-target physical-vapor deposition apparatus and indexing chuck.

Referring now to FIG. 2, a side view of a multi-target physical-vapor deposition apparatus 10 according to the present invention is depicted to include an indexing chuck mechanism 11 for enabling in-situ deposition of multi-layer material structures, from multiple targets onto a substrate in a single vacuum processing module. Each target essentially forms a process station for depositing material from the target to a substrate to form a layer of the material on the device side of the substrate. Thus, plural process stations are formed within a single vacuum chamber.

Multi-target physical-vapor deposition (PVD) apparatus 10 has a vacuum process chamber 12 with plural PVD targets 14 disposed in a target plane along the top chamber lid 15 of vacuum chamber 12. The combination of a cryo pump 16 and water pump 18 evacuate vacuum chamber 12 and remove impurities such as water in order to establish a very low vacuum base pressure. The cryo pump and water pump can reduce pressure within vacuum chamber 12 to ultraclean base pressure levels typically required for advanced physical-vapor deposition, such as in the $10^{-9}$ Torr base pressure range. This very low base pressure enables ultraclean deposition of pure and controlled multi-layer material stacks by PVD. In an alternative embodiment, a turbo-molecular pump can be used to evacuate the vacuum chamber.

Indexing mechanism 11 includes an indexing chuck and clamp assembly 20 disposed in the vacuum process chamber 12 to operationally align a substrate with each target 14 or PVD processing, and a means for moving indexing chuck 20 (e.g., a rotational indexing drive mechanism) to align with each of plural targets 14. Indexing chuck and clamp assembly 20 can use a mechanical or electrostatic clamp. Indexing chuck assembly 20 is supported by a central shaft 22 and a drive motor 24, the shaft and motor preferably located along a central axis of vacuum process chamber 12 to rotate co-axial with the central axis of the vacuum process chamber 12. Motor 24 can vary the target-to-substrate spacing by lifting the indexing chuck 20 towards targets 14 by lowering the indexing chuck 20 away from targets 14 to adjust the deposition distance between any selected target 14 and a substrate. When motor 24 lowers indexing chuck 20 as is depicted in FIG. 2, a substrate can be inserted through chamber access valve 26 onto indexing chuck 20. Motor 24 can then raise the chuck and substrate to engage a clamp (if needed) and control the distance between the substrate and targets 14 to allow optimization of physical-vapor deposition process parameters (e.g., process uniformity, repeatability, etc.).

Indexing chuck assembly 20 rotates (from one angular position to another angular position)as a radial arm in a substrate plane that is substantially parallel to the target plane, the indexing rotation occurring within vacuum process chamber 12 about the central axis with, indexing chuck 20 supported by central shaft 22. Although FIG. 2 depicts targets disposed along the top of the vacuum chamber for deposition on a substrate having the device side facing up, in alternative embodiments, the targets could be disposed below the substrate plane to support depostion with the substrate having the device side facing down. Alternatively, the target and substrate planes can be oriented to allow deposition in various vertical and horizontal orientations. Indexing chuck assembly 20 has a balancing arm 28 coupled to central shaft 22 at one end and coupled to substrate support 30 at its other end. Substrate support 30 accepts a substrate through chamber access valve 26. A clamp 32 secures a substrate by holding the substrate around its periphery against substrate support 30. A magnet assembly 34 (such as an electromagnet) can be associated with indexing chuck 20, the magnet assembly 34 providing a magnetic field for in-situ magnetic orientation of the layers during physical-vapor deposition of various material layers. In one alternative embodiment, a heating element can be incorporated with the indexing chuck to provide heating to the substrate during processing. In another alternative embodiment, a cooling device, such as a passage for pumping cooled water, can be incorporated with the indexing chuck to provide cooling to the substrate during processing.

Indexing chuck 20 can rotate about the vertical axis of its central shaft to move substrate support 30 from a first target to a second target 14 located on a multi-target lid assembly. A stepper motor 24 can rotate indexing chuck 20 to align the central axis of substrate with the central axis of any of the targets selected for the next process step. Another stepper motor 36 is used to rotate a shutter plate in order to block or expose any target 14 for the purposes of target cleaning, substrate cleaning, or physical-vapor deposition. Stepper motors 24 and 36 can be controlled separately for independent control of the angular positions of the indexing chuck 20 and indexing shutter 38. In one embodiment, stepper motor 36 is a Parker-Hanifin stepping motor having sixteen user selectable resolutions of up to 50,800 steps per revolution and a rotation speed of 3,000 rpm. A sensing mechanism associated with stepper motor 36 initiates the stepper motor at a zero rotation (e.g., home) position. From the zero rotation (home) position, stepper motor 24 can precisely rotate indexing chuck 20 to align with a predetermined selected target 14. Stepper motor 24 counts the number of steps which it rotates until it reaches a number of steps associated with the angular position of the predetermined target 14 relative to the zero rotation or home position. This relatively simple design allows precise substrate and target alignment without requiring a real-time feedback loop for the rotation of indexing chuck 20. The positions of the targets 14 along the lid of vacuum chamber 12 can be computed and associated with an appropriate number of motor steps to allow a control system such as a personal computer associated with stepper motor 24 to align substrate support 30 with various targets sequentially according to a predetermined process sequence. In alternative embodiments, plural indexing chucks can be disposed in the vacuum chamber by plural arms, or by a table supporting all of the chucks.

In operation, physical-vapor deposition apparatus 10 accepts a substrate through chamber access valve 26 and secures the substrate against substrate support 30 by engaging clamp 32 against substrate and substrate support 30. Motor 24 lifts central shaft 22 to press indexing chuck 20 upward against clamp 32 and to adjust the substrate-to-target spacing. Stepper motor 24 then rotates indexing chuck 20 to align substrate support 30 under a first predetermined target 14 (or under another process energy source such as an inductively-coupled plasma or cleaning source). A power source, such as DC (or RF) magnetron power source 40 or RF diode power source 42 can then provide power to target 14 to deposit material from target 14 onto the substrate with sputter down physical-vapor deposition. If desired, the system configuration can be inverted to perform sputter up physical-vapor deposition (by inverting the entire module upside down). The deposition is preferably static deposition, meaning that the substrate does not move relative to the target during deposition of material from the target to the substrate (and that the central axes of the substrate and the target are-preferably aligned). Stepper motor 24 can then rotate indexing chuck 20 to align substrate support 30 with a second target, and thereafter with subsequent targets, according to a predetermined sequence of process steps until the desired is multi-layered material structure has been fabricated. After positioning the indexing chuck 20 and the substrate under each process station (e.g., a PVD target), stepper motor 36 can be used to rotate the shutter plate 38 for in-situ cleaning of the target 14 and/or the substrate. During a material layer deposition, the angular coordinate of the indexing shutter 38 is set such that the target is fully exposed to allow material deposition onto the substrate.

Process considerations and the predetermined sequence for depositing a desired multi-layer material structure can be determined by complex control systems or by a simple process and machine control computer associated with physical-vapor deposition apparatus 10. As an example of how the control system could operate, the time-dependent sequential multi-step operation of indexing mechanism 11 to support the deposition of the multi-layer structure depicted in FIG. 1 can provide an illustration of the type of process control sequence and equipment needed to deposit a desired material structure.

Figure 1:
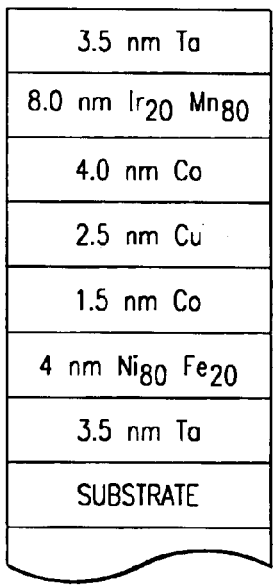
FIG. 1 depicts one embodiment of a spin-valve material structure for producing GMR material effects.

First, five targets corresponding to the five materials of the spin valve GMR structure of FIG. 1 are coupled to lid 11 at predetermined positions. For instance, any of the PVD targets comprising tantalum (Ta), iron manganese (FeMn), cobalt (Co), copper (Cu), and nickel iron (NiFe) can be mounted onto the-lid 11 in a substantially circular pattern, the circle preferably having an equal-distance radius from each target to the central axis of vacuum chamber 12. In alternative embodiments, any number of targets can be used, although present structures generally require at least two targets but not more than twelve targets. The circular pattern of the targets allows each target to align with the substrate on substrate support 30 when indexing chuck 20 is rotated about the central axis which is perpendicular to the substrate plane. Each target 14 has an associated power supply to support physical-vapor deposition. Although mounting the targets onto the vacuum chamber lid will support sputter-down physical-vapor deposition, sputter-up or other configurations of deposition processes can be supported in alternate embodiments by disposing the targets in other locations in the vacuum chamber. Further, each target can have its own associated power supply, or alternatively, the targets can share one or more associated DC or RF power supplies.

In order to fabricate the multi-layer stack of FIG. 1, indexing chuck 20 is rotated by stepper motor 36 to align the substrate with the tantalum target position. A controller, such as a process control computer associated with apparatus 10, can direct stepper motor 36 to rotate a predetermined number of steps in conjunction with a home sensor to find the angular coordinate corresponding to the position of the tantalum target. The controller can also set equipment state parameters (e.g., DC magnetron power, pressure, and deposition time) to deposit 3.5 nanometers of tantalum on the substrate. For instance, the controller can have up/down actuator and motor assembly 24 lift chuck 20 to achieve a predetermined deposition distance between the substrate and the tantalum target in order to establish the optimal deposition uniformity and material properties. The controller can also operate cryo pump 16 and water pump 18 to evacuate vacuum chamber 12 to a predetermined pressure and to remove contaminants such as water vapor down to very low base pressures (e.g., $\leqq 5\times 10^{-9}$ Torr). Although stepper motor 24 rotates indexing chuck 20 to position a substrate underneath any one of the plurality of targets 14, in other embodiments the targets could be moved relative to the indexing chuck by instead moving the targets, the chuck, or by moving both the targets and the chuck. The preferred embodiment of this invention, however, utilizes stationary targets (mounted on the vacuum chamber lid) in conjunction with an indexing chuck assembly.

After the tantalum target and substrate are aligned, the controller can initiate physical-vapor deposition of Ta by applying power (e.g., DC electrical power) from the power source to the tantalum target for a predetermined deposition time and at a predetermined power level. The controller can cease deposition by eliminating the power applied to the target once the thickness of the tantalum has reached the desired 3.5 nanometers. If necessary, a target pre-clean can be performed prior to PVD of Ta by first closing the shutter and applying the electrical power to Ta target and then performing deposition of Ta by opening the shutter.

In one embodiment, the controller can vary the power over time, for instance by pulsing (e.g., pulsed DC power), to allow the material to diffuse over the substrate. For instance, the controller can provide power with electrical chopping by switching the power source on and off. As an example, while 400 watts of power (average electrical power) could deposit a two nanometer thick film in a single one second pulse, the same material layer thickness may also be deposited using 10 sequential cycles of 10% duty-cycle pulses, each having a 400 watt (peak power) 100 millisecond pulse followed by 900 milliseconds of no power. Electrical chopping can combine the advantages associated with precision controlled low film growth rates, such as improved surface diffusion of sputtered material (and improved material layer microstructure control), with the desirable properties of a high power deposition environment, such as improved plasma density and enhanced plasma stability. In essence, electrical chopping mimics the effects of dynamic deposition by changing the plasma directed at the substrate over time. Filaments or other electron sources proximate the target can aid the initiation of deposition and stabilization of plasma by providing an electric charge (e.g., electrons) to the plasma associated with the target. Other energy sources such as optical sources may be used instead of electron sources to accomplish the same result.

Once the tantalum layer deposition is complete, stepper motor 24 can rotate indexing chuck 20 to align the substrate with the position of the nickel iron (NiFe) target. The controller can again adjust the equipment state parameters (e.g., DC magnetron power, substrate temperature, pressure, etc.) and apply power to deposit a 4 nanometer thick layer of nickel iron (e.g., Ni 80%, Fe 20%) onto the substrate. Again, if desired, a sputter pre-clean process can be performed on the NiFe target (by first closing the indexing shutter) in order to clean the target prior to the PVD process. Stepper motor 24 can continue to rotate indexing chuck 20 to align with each subsequent target according to the sequence of the multi-layer structure. Note that the tantalum and cobalt targets will each make two deposits according to the predetermined sequence (see FIG. 1), meaning that indexing chuck 20 will have to align the substrate with each of these targets twice during the multi-step spin-valve GMR process sequence. Alternatively, two targets each of tantalum and cobalt could be used. Once the multi-layer structure is complete, the substrate can be removed from vacuum chamber 12 through access valve 26 and replaced with a new substrate that will be processed for deposition of a similar multi-layer spin-valve GMR structure (or any other multi-layer material structure).

Figure 3:
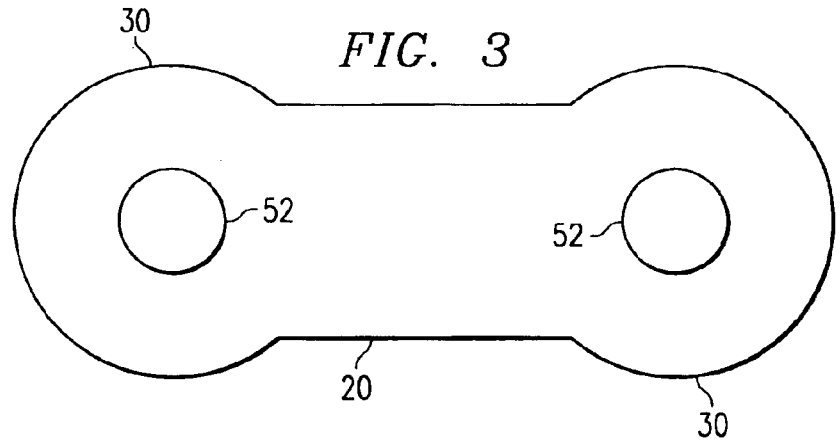
FIG. 3 depicts a top view of an indexing chuck having plural substrate supports.

Referring now to FIG. 3, one embodiment of an indexing chuck 20 is depicted having plural substrate supports 30. Each substrate support 30 can securely hold one substrate as described above (or a substrate carrier comprising a plurality of substrates). The use of plural substrate supports in the same vacuum chamber can enhance processing throughput by allowing simultaneous processing of multiple substrates and deposition of plural multi-layer structures in the same vacuum environment. The deposition on plural substrates can be accomplished by sequentially depositing individual layers or complete structures on a first and then a second substrate. Alternatively, simultaneous deposition of the same material from plural targets or of different materials from plural targets to each substrate can be accomplished. In a PVD chamber with N target positions, we may use indexing chuck designs with either a single chuck arm or multiple (2–N) chuck arms.

For instance, one relatively simple multi-layer laminated structure used in thin-film head devices can be used to illustrate the operation of physical-vapor deposition apparatus 10 equipped with plural substrate supports (i.e., a plurality of chuck arms). Multiple layers of silicon dioxide ($SiO_2$) and iron tantalum nitride (FeTaN) alloy deposited on a substrate in an alternating sequence can form a laminated magnetic multi-layer structure suitable as low-loss magnetic flux guides and inductive cores. First and second target positions a comprised of silicon dioxide, as well as third and fourth target positions comprised of an iron tantalum nitride alloy can be disposed in a circular configuration on the lid of the vacuum chamber. The configuration can correspond to the position of each substrate support so that an indexing chuck 20 with two substrate support arms (spaced apart by 180°) will align both substrates either with the first and second targets simultaneously or with the third and fourth targets simultaneously. For instance, the targets can each be arranged in 90 degree increments (assuming four target positions), while the substrate support chuck arms can be arranged at 180° from one another (assuming two arms).

A personal computer associated with physical-vapor deposition apparatus 10 can provide instructions to stepper motor 24 to rotate indexing chuck 20 from the first or second target to the third or fourth target according to the predetermined sequence, with a power source depositing the silicon dioxide or iron tantalum nitride alloy when substrate supports 30 align with the appropriate targets. The indexing chuck can repeatedly align the substrate supports to allow the deposition of many (e.g., fifty or more) layers of each material. In this way, physical-vapor deposition apparatus 10 can advantageously deposit plural materials from plural targets in a single vacuum chamber module, thus increasing throughput and decreasing the likelihood of introducing impurities to the deposited structure.

In alternative embodiments, the number and composition of targets can be altered to allow "continuous flow" or "assembly-line" processing of substrates. For example, a multi-layer structure having layers in a sequence of T1, T2, T3 and T4 can be deposited on each of four substrates by using an indexing chuck with four substrate holders (four chuck arms spaced apart by 90° from one another). Four targets T1, T2, T3 and T4, and the four substrate holders (four chuck arms) can be arranged in matching circular configurations, each of the targets and each of the holders divided into 90 degree intervals. A first substrate S1 on a first support can be aligned with target T1 for deposition of the first layer in the sequence. The indexing chuck can then be rotated to align S1 with T2, and another substrate, S2, can be added on the second substrate support arm aligned with T1 for simultaneous deposition of T2 onto S1 and T1 onto S2. The process repeats to allow simultaneous deposition of T3 onto S1, T2 onto S2, and T1 onto a new substrate S3 supported on the third support (third chuck arm). The next repetition completes the deposition of the predetermined sequence on S1 by simultaneously depositing T4 onto S1, T3 onto S2, T2 onto S3, and T1 onto a new substrate S4 supported on the fourth support. S1 can then be removed and replaced with a new substrate to allow continued (continuous flow) production of the desired multi-layer structure as described above.

Figure 4:
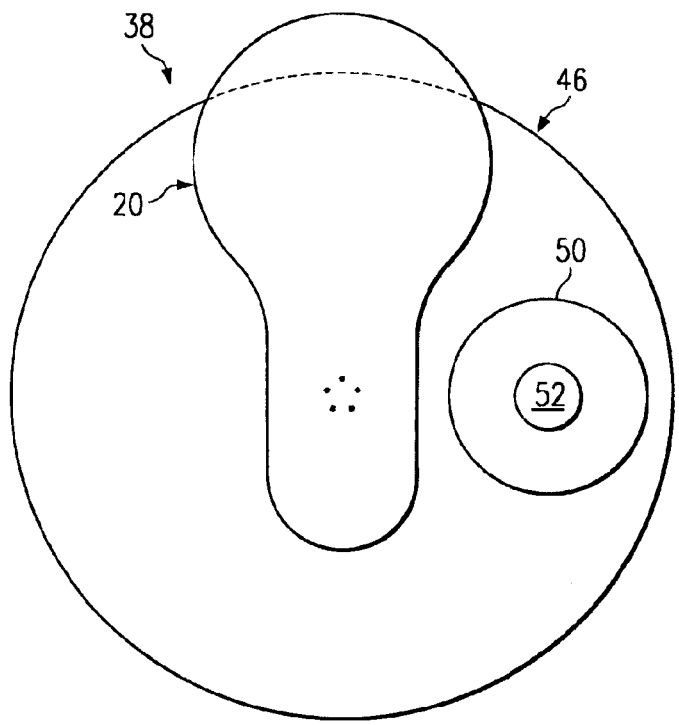
FIG. 4 depicts a top view of a shuttering mechanism in conjunction with an indexing chuck.

Referring now to FIG. 4, a shuttering mechanism is depicted which can enhance cleanliness of the target materials, control of film thickness and the quality of interface cohesion between deposited films. Shutter assembly 44 is disposed in vacuum chamber 12 to interpose between indexing chuck 20 and the targets 14. Shutter assembly 38 has a rotating shutter plate 46 coupled to a shutter indexing rotation stripper motor 36, the shutter rotating in a shutter plane that is between and substantially parallel to the substrate plane and the target plane. Shield 46 has a hole or circular opening 50 which can allow physical-vapor deposition of a material from a selected target to a substrate 52 while blocking the access to the remaining targets. Shield hole 50 has a diameter which is somewhat larger than the diameter of an associated target (or its diameter may be larger than the diameter or diagonal dimension of the substrate and smaller than the target diameter). The shutter assembly has two primary purposes. One purpose is sputter cleaning of any of the targets by closing the shutter at the selected target location prior to opening the target and performing the PVD process. The second purpose is to align the shutter opening with any selected target to perform depositions while blocking the non-selected targets.

In operation, shield 46 is interposed between the target plane and the substrate plane with shield hole 50 aligned with substrate support 30 and the selected target during the deposition process. Shield 48 rotates with indexing chuck 20 to maintain a path for deposition of material from targets 14 to substrate 52 (except during target sputter clean when the shutter opening is not aligned with the selected target).

When substrate 52, shield hole 50, and a selected target 14 are axially aligned, shutter assembly 38 can then rotate to block shield hole 50, thus preventing deposition of material onto substrate 52. Shutter assembly 38 can be rotated between this target-to-substrate blocking configuration and a target-to-substrate open view deposition configuration in which shutter opening 50 is aligned axially between the target and the substrate to allow deposition of material from the target to the substrate. An electric or pneumatic actuator (e.g., stepper motor 36) is associated with shutter assembly 38 for rapidly moving shutter plate 46 between the blocking (no deposition and/or target sputter cleaning mode) and deposition configurations. In one embodiment, shutter plate 46 is comprised of a thin titanium or stainless steel sheet (if necessary, reinforced with radial ribs) which is insulated from direct electrical contact with the target or the substrate (the shutter plate 46 is preferably grounded) so as to allow deposition from the target to the substrate (with the shutter opening aligned with the selected target and the substrate) as well as to allow cleaning of the target (by applying power to the target) and cleaning of the substrate (by applying power to the indexing chuck assembly 20. The light weight of this stainless steel or titanium sheet enhances rapid actuation between the blocking and deposition configurations (typical target-to-target shutter indexing time is less than 5 seconds).

Shutter assembly 38 improves the control of the deposition of a material from a target to substrate 52. For instance, power can be applied to the target to stabilize the plasma and initiate physical-vapor deposition to shutter 46 (in conjunction with target cleaning) while shutter 46 is in a blocking configuration for the selected target. This advantageously pre-cleans the target by depositing the external layer of material from the target to shutter 46, and also allows stabilization of the deposition process by first stabilizing the plasma. Shutter 46 can then be rapidly actuated or indexed to, a deposition configuration (shutter opening 50 axially aligned with the target and the substrate) which allows the material from the target to be deposited onto substrate 52. After a predetermined deposition time, shutter 46 can be actuated back (by index rotation) to a blocking configuration to terminate deposition of material onto substrate 52, and then electrical power (either RF or DC power in pulsed or continuous mode) can be cut off from the target. In one alternative embodiment, shutter 46 can provide dynamic-mode mechanical chopping by opening and closing shutter 46 to control the duty cycle of the pulsed deposition process described above as an alternative to electrical chopping. Similar to electrical chopping, mechanical chopping (using the rotating shutters) mimics the effect of dynamic physical-vapor deposition without actually rotating the substrate relative to the target during deposition of the material from the target. A pulsed deposition (either wing pulsed DC/RF electrical power or by mechanical chopping wing shutter rotation) process can be used to obtain precision controlled reduced deposition rates for controlled deposition of very thin films. In another embodiment, shutter 46 can preclean a substrate rather than a target by applying an electrical bias (RP or DC) to the substrate chuck while closing the shutter.

Shutter 46 advantageously provides a capability for precise control over the deposition time associated with each target, thus eliminating the transient plasma start-up and stabilization effects. Further, the physical-vapor deposition plasma and related process can stabilize while shutter 46 is in a blocking configuration, thus allowing a stable plasma and sputtering flux from the target to develop before shutter 46 is actuated to its deposition configuration (i.e., shutter hole aligned with target and substrate). In addition, the stabilization of the PVD plasma and deposition process provide in conjunction with precision control of the active process time precise and abrupt interfaces between material layers. Thus, shutter mechanism 38 can be used to enable or support deposition of material structures for applications such as spin-value GMR and magnet RAM (MRAM) devices.

Figure 5:
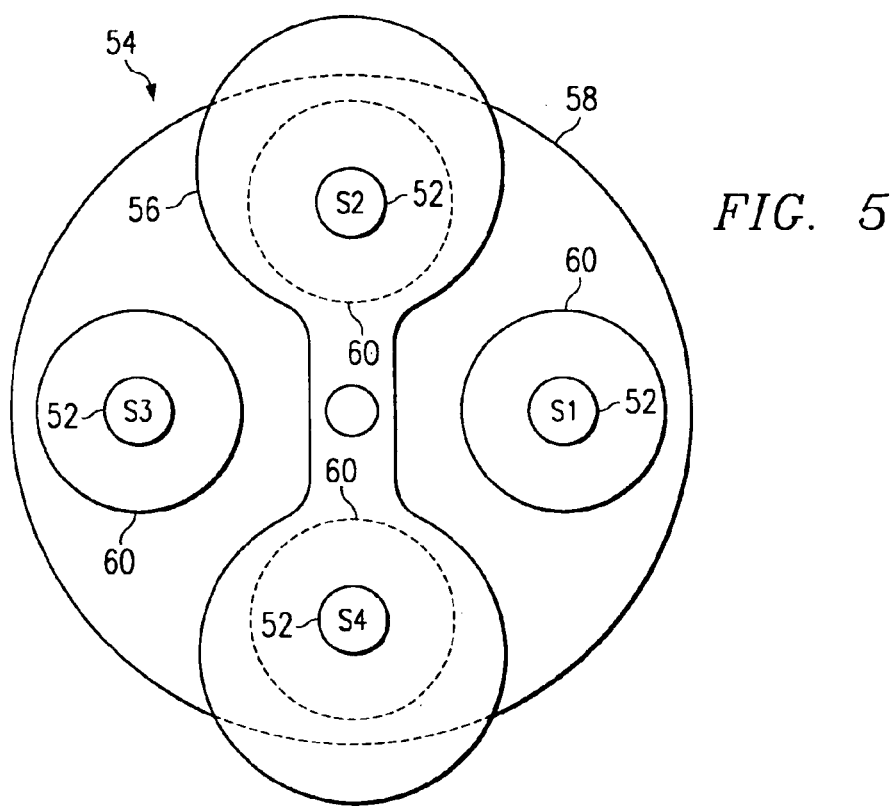
FIG. 5 depicts a top view of a shuttering mechanism for plural targets in conjunction with an indexing chuck having plural substrate supports.

Referring now to FIG. 5, another embodiment of an alternative shutter assembly 54 is depicted. Shutter assembly 54 can support simultaneous or concurrent depositions from plural (e.g., two or more) targets associated with plural shield holes 60 in shield 58 (example shown in FIG. 5 shows two shield holes in conjunction with a 2-arm indexing chuck and up to four targets). For instance, shutter assembly 54 can support the simultaneous or concurrent depositions of a multi-layer structure comprised of iron tantalum nitride (FeTan) and silicon dioxide ($SiO_2$) onto two separate substrates as is described above. Shutter assembly 54 simply rotates with the indexing drive mechanism and alternates between a blocking position and deposition position to precisely control depositions from the two different targets in order to fabricate a laminated $FeTan/SiO_2$ structure.

Figure 6:
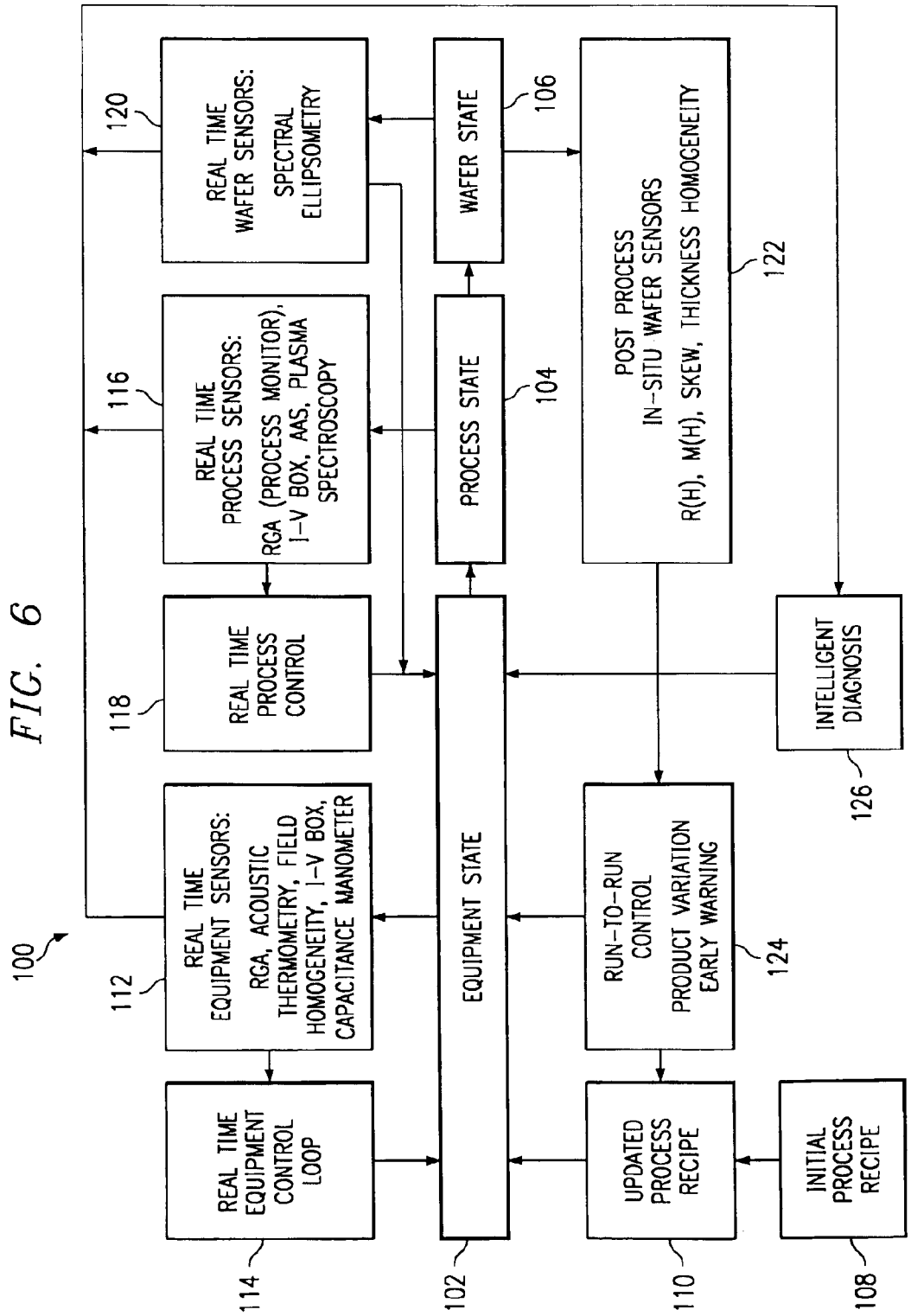
FIG. 6 depicts a block diagram of a sensor-based control methodology using in-situ measurements during physical-vapor deposition processes.

One significant advantage of the multi-target physical-vapor deposition apparatus 10 of this invention depicted herein over existing or prior art dynamic physical-vapor deposition systems is that the static multi-target indexing deposition used by the present invention allows the use of various in-situ sensors in the vacuum chamber to monitor the substrate or process states and to control the substrate and physical-vapor deposition process parameters. Referring now to FIG. 6, one embodiment of a monitoring and control system 100 is depicted. Monitoring and control system 100 relies upon in-situ sensors that can be located in or proximate the actual deposition vacuum chamber for real time, in-situ measurements of deposition parameters (including the substrate state, process state, and/or equipment state parameters), or in-vacuu sensors that can be located in a dedicated vacuum metrology module attached to a central wafer handler for in-vacuu pre/post-deposition measurements and run-by-run process control. The following table lists various useful in-situ process and equipment state sensors which can measure equipment or process or substrate state parameters directly in the vacuum chamber or through chamber viewports in support of monitoring and control system 100.

| Sensor/Supplier | Primary Application | Secondary Application |
|---|---|---|
| B-H looper with Helmholtz and pickup coils. Coils can be installed inside chamber to probe an effective diameter of 3". Chuck should have fixture to pick up, rotate and put down wafer. | $H_{cc}$, $H_{ch}$, $H_k$, $\alpha_{80}$ and B/ thickness of individual films. Low field B-H loop of spin valve GMR: coercivities, coupling field, moments, etc. | Use pickup coil as eddy current sensor to measure sheet resistance. Use Helmholtz coils to apply field on substrate for MR and Kerr-MO measurements. |
| Four point probe sensor. Probe head can be mounted over wafer center and may extend/retract away from wafer surface. | Sheet resistance of individual electrically conductive films and stacks. | MR ratio of ferromagnetic films. GMR ratio of spin valves. |

-continued

| Sensor/Supplier | Primary Application | Secondary Application |
| --- | --- | --- |
| Spectral ellipsometer that can be installed on optical ports to measure a spot on the wafer. | Film thickness of individual films and stacks. | Exploit Kerr-MO effect by performing ellipsometry with applied external field. |
| XRF sensor installed on optical ports (with special windows). | Composition and thickness of individual films and stacks. | |

The following table lists sensors which can be implemented in a metrology module associated with the physical-vapor deposition apparatus 10.

| Sensor/Supplier | Primary Application | Secondary Application |
| --- | --- | --- |
| Spectral ellipsometer installed on optical ports to measure a spot at the center of the wafer. | Film thickness for individual films and stacks (as well as thickness uniformity profiles). | Reflectance (specular/non-specular) measurement of surface roughness. Exploit Kerr-MO effect by performing ellipsometry with applied external field. |
| I-V Probe | Plasma source current and voltage | Plasma diagnostics |
| Optical emission sensor in conjunction with current/voltage probes. | Estimation of instantaneous deposition rate through indirect measurement of plasma density. | Small signal power perturbation to estimate system gain (detect drifts) and alter sputtering power to maintain deposition rate. |
| RGA | Confirmation of partial pressures pre and post processing. | Implementation of pump/purge/burn-in to stay within partial pressures limits. |
| Acoustic thermometer embedded in chuck. | Wafer temperature (including temperature uniformity) | Correct for drifts in wafer temperature from run to run. |
| Magnetic flux/skew sensor embedded in chuck. | Magnetic flux and skew on chuck surface to detect buildup of ferromagnetic and AFM layers on wafer clamp and increase in magnetron stray field as target erodes. | Equipment diagnostics |
| Atomic absorption sensor installed on optical port. | Flux of atomic species in plasma. | Estimate deposition rate based on model that includes effect of pressure and target to substrate spacing. |

Any one or a combination of the sensors in Table 1 or Table 2 can provide input to a control loop for the purpose of equipment/process/wafer state parameter control for optimizing a deposition process. The sensors and associated control for each sensor can be classified as related to a wafer state, which involves the properties of deposited films; a process state, which involves the plasma density, ion flux, ionization ratio and other process parameters; and equipment state, which varies the process state by changing equipment-related parameters such as vacuum chamber pressure, power settings, and substrate-to-target spacing.

Figure 7:
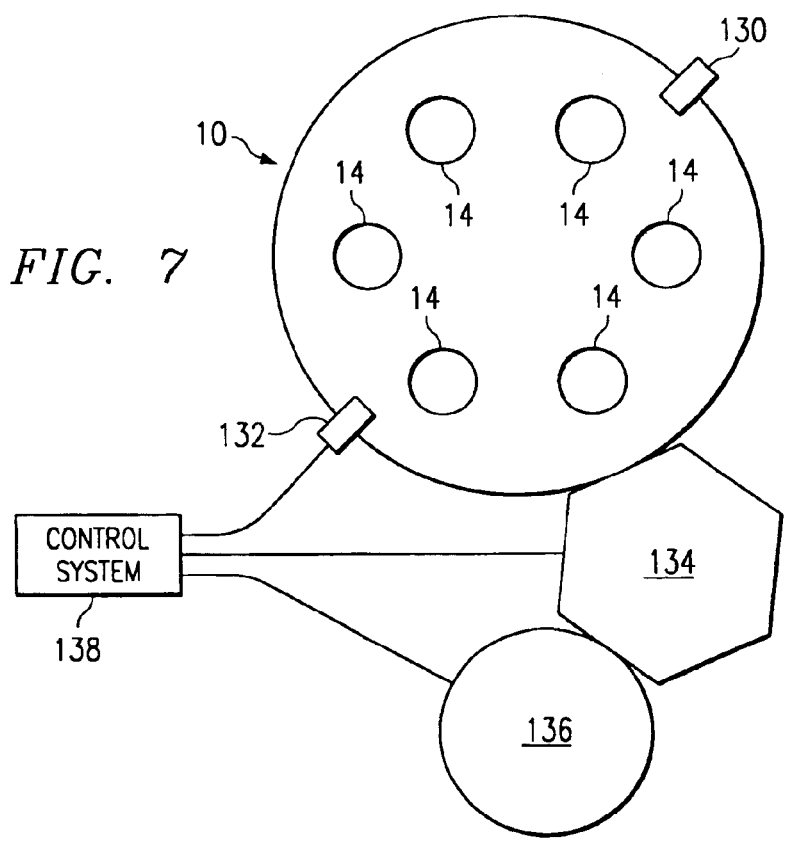
FIG. 7 depicts a top view of a vacuum metrology module associated with a cluster tool and deposition chamber.

Referring now to FIG. 7 a top view of a cluster tool 134 and a vacuum metrology module 136 are depicted in association with physical vapor deposition apparatus 10 to support monitoring of process parameters with monitoring sensors as described in the above table. An optical port 130 can accept a sensor, such as a signal associated with a spectral ellipsometer, so that measurements can be made by a sensor associated with a second optical port 132. Vacuum metrology module 136 can hold sensors to obtain in-vacu post process sensor readings. An associated control system 138 can accept sensor measurements to provided model-based process end-point detection or other control as described herein.

Monitoring and control device 100 depicted in FIG. 6 can enhance physical-vapor deposition process control to provide high-quality multi-layer structures such as spin valve GMR material stacks. Monitoring and control device 100 can operate using one or more processors, such as personal computers, associated with vacuum chamber 12. Equipment state 102, process state 104, and wafer state 106 depict the parameters associated with physical-vapor deposition. Physical-vapor deposition is initiated with an initial process recipe 108 which can be altered by feedback signals to create updated tuned process recipe 110. The updated process recipe 110 establishes an equipment state 102 by providing equipment state settings such as vacuum chamber pressure settings, electrical power settings, substrate cooling or heating, and substrate-to-target spacing settings. Real-time equipment sensors 112 sense the equipment settings and provide the sensed equipment settings to real-time equipment controller 114. Real-time equipment control loop 114 incorporates the output of the real time equipment sensors 112 to provide corrections for the equipment state needed to ensure that the equipment state achieves the parameters set forth in the updated process recipe 110.

Equipment state 102 can influence the process state 104, such as the plasma density, ion flux, and ionization ratio produced by associated equipment settings. Real-time process sensors 116 monitor the process state and provide measurements of the process state to real-time process control loop 118. Real-time process control loop 118 can provide corrective action to equipment state 102, thus altering the equipment state to achieve a predetermined process state when the process state produced by equipment settings according to the process recipe varies from expected performance.

Process state 104 results in an output depicted as wafer state 106 such as the quality or thickness of a film deposited on a substrate. Real-time wafer sensors 120 can measure film thickness through an in-situ spectral ellipsometry thickness monitor having access to the wafer through a port located along the vacuum chamber walls, and can provide film thickness measurements to alter equipment state 102 to correct deviations from expected thickness results. Wafer state 106 can also be measured by post-process in-situ wafer sensors 122. Post-process wafer measurements can be passed to run-by-run loop 124 which provides early warning and product variation control aspects. The early warning aspect monitors deposition results to detect failures that can be caused by sudden changes in the process, such as flaking or arcing, but that cannot be corrected by real-time control. The early warning aspect can notify an operator of a failure to meet specifications to cancel further processing of the failed wafer. This early warning can provide significant savings by scrapping failed wafers before continued expensive processing is accomplished. The product variation control aspect of the run-by-run loop 124 monitors slow process changes or drifts that can result from target wear, deposition on chamber walls and wafer chucks and other wafer equipment aging effects. Process changes can also be introduced by factors other than the physical-vapor deposition apparatus itself, such as variations in targets and substrates. Thus, product variation control aspect can identify lot-to-lot or run-to-run variations, and can inform an operator of these variations. The product variation control provides an update to the process recipe 110 based on quantitative models for the relationship between physical properties, microstructure, process conditions, and equipment state to optimize process recipes.

Intelligent diagnosis loop 126 can accept process measurements and wafer measurements to provide equipment diagnosis by analyzing anomalous process conditions not otherwise serious enough to trigger hardware fault. Intelligent diagnosis loop 126 monitors trends in process conditions to provide a prognosis of the equipment state which can predict faults and future failures. Intelligent diagnosis loop 126 output can allow optimal scheduling of equipment maintenance to increase uptime, and accordingly to provide better throughput.

Monitoring and control device 100 can provide a number of advantages for processing of wafers on an industrial scale. First, the early warning, drift recognition and real-time control can reduce the number of scrapped wafers. Second, fault detection will allow preventive maintenance based on actual equipment state rather than a set time schedule, and slow degradation of equipment can be compensated to optimize process parameters with direct feedback. Third, feedback control based on real-time measurements can provide dramatic improvement of process control to enable reliable processing of multi-layer structures for performing advanced GMR effects. Finally, the wafer, process, and equipment state sensors will enable rapid development of process models to improve existing processes based on measured production results.

Although the present invention has been described in detail, it should be understood that various changes, substitutions and alterations can be made hereto without departing from the spirit and scope of the invention as defined by the appended claims.

What is claimed is:

1. An apparatus for physical-vapor deposition of a multi-layer material structure onto a substrate, the material structure having plural layers deposited according to a predetermined sequence, each layer comprised of one of plural materials, the apparatus comprising:

a single, contiguous vacuum chamber;

plural targets disposed in the vacuum chamber, at least one target comprised of one of the plural materials;

at least one power source associated with the plural targets for supporting physical-vapor deposition;

a substrate support chuck disposed in the vacuum chamber for supporting the substrate;

an electromagnet coupled to the substrate support chuck, the electromagnet for formation of a magnetic field proximate to the substrate; and a mechanical indexing mechanism that moves the substrate support chuck and electromagnet relative to the plural targets in order to align and maintain the substrate in substantial alignment with any one of the targets to deposit the multi-layer material structure of the plural materials according to the predetermined sequence;

the electromagnet moving along with the substrate support chuck such that the electromagnet may support deposition of magnetic materials onto the substrate at any of the plural targets.

2. The apparatus of claim 1 wherein said physical-vapor deposition comprises a plasma sputtering process.

3. The apparatus of claim 1 wherein said physical-vapor deposition comprises an ion-beam deposition process.

4. The apparatus of claim 1 wherein said physical-vapor deposition comprises an evaporation process.

5. The apparatus of claim 1 wherein each of said plural targets form a process station, with the plural process stations sharing said vacuum chamber.

6. The apparatus of claim 1 wherein said multi-layer material structure is a spin-valve GMR sensor.

7. The apparatus of claim 1 wherein said multi-layer material structure is an MRAM structure.

8. The apparatus of claim 1 wherein said multi-layer material structure is a periodic laminated structure.

9. The apparatus of claim 1 wherein said multi-layer material structure is a colossal MR sensor structure.

10. The apparatus of claim 1 wherein said multi-layer material structure is a semiconductor interconnect structure.

11. The apparatus of claim 5 wherein the target in any process station may be replaced with an inductively-coupled plasma source for surface cleaning of said substrate.

12. The apparatus of claim 1 wherein said plural targets comprise 3 to 6 targets.

13. The apparatus according to claim 1 wherein the targets are disposed in a target plane and the substrate support chuck is disposed in a substrate plane, the substrate plane substantially parallel to the target plane.

14. The apparatus of claim 13 wherein said target plane is located above the substrate plane with the substrate device side facing up.

15. The apparatus of claim 13 wherein said target plane is located below the substrate plane with the substrate device side facing down.

16. The apparatus according to claim 13 wherein said mechanical indexing mechanism is associated with the substrate support chuck for moving and aligning the substrate support chuck to any one of the plural targets according to the predetermined sequence.

17. The apparatus according to claim 16 wherein the mechanical indexing mechanism comprises:

a motor; and an indexing arm coupled to the motor and the substrate support chuck, the indexing arm for rotating the substrate support chuck in the substrate plane.

18. The apparatus of claim 17 wherein said indexing arm is a radial arm connected to a central indexing axis.

19. The apparatus of claim 17 wherein said mechanical indexing mechanism comprises rotational indexing around a central axis.

20. The apparatus of claim 18 wherein said central axis corresponds to the central axis of the vacuum chamber.

21. The apparatus according to claim 17, wherein the electromagnet supports deposition of multi-layer structures comprising magnetic material layers.

22. The apparatus of claim 17 wherein said substrate support chuck comprises a heating element for heating said substrate.

23. The apparatus of claim 17 wherein said substrate support chuck comprises a cooling device for actively cooling said substrate.

24. The apparatus of claim 17 wherein said substrate support chuck comprises either a mechanical clamp or an electrostatic clamp for substrate clamping.

25. The apparatus according to claim 1 further comprising a sensor associated with the vacuum chamber for measuring deposition process state parameters.

26. The apparatus according to claim 25 wherein the sensor further comprises a real-time in-situ sensor disposed in the vacuum chamber.

27. The apparatus of claim 26 wherein said sensor is a spectral ellipsometer.

28. The apparatus according to claim 25 further comprising a vacuum metrology module associated with the vacuum chamber, the metrology module for holding at least one sensor to obtain in-vacuu post-process measurements.

29. The apparatus of claim 28 wherein said metrology module and said physical-vapor deposition apparatus are docked onto a vacuum cluster tool hub.

30. The apparatus according to claim 25 further comprising a control system associated with the sensor and with said apparatus for controlling the physical-vapor deposition process parameters.

31. The apparatus according to claim 30 wherein the control system is further associated with the power source for varying electrical power applied to the targets to perform electrical chopping.

32. The apparatus of claim 31 wherein said control system is used for sensor-based, model-based process end-point detection.

33. The apparatus according to claim 31 wherein the power source comprises a radio-frequency power source.

34. The apparatus according to claim 31 wherein the power source comprises a direct current power source.

35. The apparatus according to claim 1 further comprising an up/down actuation mechanism in conjunction with the substrate support chuck for adjusting the spacing between the targets and the substrate.

36. The apparatus according to claim 35 wherein a control system is further associated with the up/down actuation mechanism for controlling the spacing between the targets and the substrate.

37. The apparatus according to claim 1 further comprising a vacuum pump system associated with the vacuum chamber for varying the pressure and for establishing a load-pressure processing environment within the vacuum chamber.

38. The apparatus of claim 37 wherein said vacuum pump system comprises a cryo pump.

39. The apparatus of claim 37 wherein said vacuum pump system comprises a water removal pump.

40. The apparatus of claim 37 wherein said vacuum pump system comprises a turbo-molecular pump.

41. The apparatus according to claim 37 wherein a control system is further associated with the vacuum pump for controlling the pressure within the vacuum chamber.

42. The apparatus according to claim 1 further comprising a shutter associated with the vacuum chamber, the shutter operational to block deposition when inserted between the substrate support chuck and a selected target, the shutter further operational to allow deposition when removed from between the substrate support chuck and the selected target.

43. The apparatus of claim 42 wherein said shutter comprises a metallic plate with at least one large-area hole.

44. The apparatus of claim 43 wherein said hole is aligned between the substrate support chuck and the selected target to allow deposition of the target material onto the substrate.

45. The apparatus according to claim 13 further comprising:
 a shutter mechanism associated with the vacuum chamber, the shutter mechanism comprising:
  a shutter disposed in the vacuum chamber in a shutter plane, the shutter plane substantially parallel to and between the target plane and the substrate plane; and
  a shutter indexing actuator coupled to the shutter for moving the shutter between a blocking configuration and a deposition configuration.

46. The apparatus of claim 45 wherein said shutter indexing actuator operates in a static mode to move said shutter into predetermined stationary position, with respect to said plural targets.

47. The apparatus of claim 45 wherein said shutter indexing actuator operates in a dynamic rotation mode to perform mechanical chopping of the physical-vapor deposition process.

48. The apparatus according to claim 45 wherein the plural targets are disposed in a substantially circular configuration having a central axis, the apparatus further comprising:
 plural substrate support chucks disposed in the vacuum chamber along the substrate plane, the mechanical indexing mechanism operable to align each substrate support chuck with one of the plural targets; and
 wherein the shutter mechanism further comprises at least one shutter disposed in at least one shutter plane about the central axis, said at least one shutter operable for rotating between a blocking configuration and a deposition configuration with respect to at least one substrate support chuck.

49. The apparatus of claim 48 wherein said at least one shutter is connected to an electrical ground potential.

50. The apparatus of claim 48 wherein the radial coordinates of the center points of said plural targets and the radial coordinates of the center points of said plural substrate support chucks are all substantially equal.

51. The apparatus of claim 48 wherein said plural substrate support chucks are coupled to plural indexing arms.

52. The apparatus of claim 51 wherein said plural indexing arms couple to a single rotational indexing mechanism at the center of said vacuum chamber.

53. The apparatus of claim 48 wherein the number of said plural targets is an integer multiplier of the number of said plural substrate support chucks, with the integer multiplier being a number between 1 and 6.

54. The apparatus according to claim 48 wherein the shutter is comprised of a stainless steel plate.

55. The apparatus of claim 48 wherein the shutter is comprised of a titanium plate.

56. A method for physical-vapor deposition of a multilayer material structure onto a substrate, the structure having at least a first layer comprised of a first material and a second layer comprised of a second material, the method comprising the steps of:
 disposing a first stationary target in a single, contiguous vacuum chamber, the first target comprised of the first material;
 disposing a second stationary target in the vacuum chamber, the second target comprised of the second material;
 supporting the substrate on a substrate support chuck coupled to a mechanical indexing mechanism in the vacuum chamber;
 maintaining the substrate support chuck in substantial alignment with the first stationary target with the mechanical indexing mechanism;
 depositing the first material from the first stationary target onto the substrate by applying electrical power to the first target, the vacuum chamber remaining contiguous during the deposition of the first material onto the substrate;
 using the mechanical indexing mechanism to move the substrate support chuck, along with an electromagnet coupled to the substrate support chuck and operable to support deposition of magnetic materials onto the substrate at any of the first or second targets, from the first stationary target to the second stationary target;

maintaining the substrate support chuck in substantial alignment with the second stationary target with the mechanical indexing mechanism;

applying a magnetic field proximate to the substrate with the electromagnet coupled to the substrate support chuck in substantial alignment with the second stationary target; and depositing the second material from the second stationary target onto the substrate by applying electrical power to the second target, the vacuum chamber remaining contiguous during the deposition of the second material onto the substrate.

57. The method of claim 56 wherein said multi-layer material structure is a spin-valve GMR sensor, a laminated structure, a colossal MR structure, or a semiconductor interconnect structure.

58. The method according to claim 56 wherein the mechanical indexing mechanism comprises a motor coupled to an indexing arm, the indexing arm coupled to the substrate support chuck.

59. The method according to claim 59 wherein the motor comprises an electrical stepper motor.

60. The method according to claim 59 further comprising the step of adjusting the spacing between the substrate and the first target with an up/down actuating mechanism coupled to the indexing arm and the substrate support chuck.

61. The method according to claim 60 wherein said depositing the first material step further comprises:

aligning the substrate support chuck with the first stationary target;

inserting a shutter between the first stationary target and the substrate;

initiating deposition of the first material onto the shutter by applying an electrical power to the first stationary target;

removing the shutter to provide substrate-to-target view and to allow deposition of the first material to the substrate; and inserting the shutter between the first stationary target and the substrate to block deposition of the first material onto the substrate.

62. The method of claim 61 wherein said shutter is used to establish precision material layer thickness control by stabilizing the plasma with the shutter closed and by controlling the deposition time via the duration of opening the shutter.

63. The method according to claim 60 further comprising the steps of precleaning the first stationary target before depositing the first material onto the substrate, the precleaning step comprising the steps of:

inserting a shutter between the first stationary target and the substrate; and depositing material from the first stationary target onto the shutter by applying an electrical power to the first target.

64. The method according to claim 56 further comprising the steps of precleaning the substrate before depositing the first material onto the substrate, the precleaning step comprising the steps of:

inserting a shutter between the first stationary target and the substrate; and applying an electrical power to said substrate support chuck.

65. The method according to claim 56 wherein said depositing the first material further comprises providing a predetermined electrical power to the first target for a predetermined time, the power and time corresponding to a desired layer thickness and other material layer properties.

66. The method according to claim 65 wherein said depositing the first material step further comprises depositing the first material with electrical chopping through modulation of an electrical power source.

67. The method according to claim 65 wherein said depositing the first material step further comprises depositing the first material with mechanical chopping through rotation indexing modulation of a shutter.

68. An apparatus for physical-vapor deposition of plural material layers onto a substrate, each layer comprised of one of plural materials, the apparatus comprising:

a single, contiguous vacuum chamber, plural stationary targets disposed in the vacuum chamber, at least one target comprised of one of the plural materials;

a substrate support chuck disposed in the vacuum chamber for supporting the substrate in a deposition configuration wherein the substrate is maintained in substantial alignment with any one of the plural targets;

an electromagnet coupled to the substrate support chuck, the electromagnet for formation of a magnetic field proximate to the substrate for supporting deposition of a magnetic material layer by any of the plural targets;

an indexing arm coupled to the substrate support chuck and operable to move the substrate support chuck and electromagnet relative to the plural targets in order to align and maintain the substrate in substantial alignment with any one of the plural targets;

an electrical power source associated with the plural targets and the substrate for supporting physical-vapor deposition; and a mechanical shutter mechanism interposed between the plural targets and the substrate support chuck, the mechanical shutter mechanism having;

a deposition configuration for each of the plural targets wherein physical-vapor deposition onto the substrate from that target is allowed; and a blocking configuration wherein physical-vapor deposition onto the substrate from that target is prevented.

69. The apparatus of claim 68 wherein said power source operates in conjunction with a DC magnetron energy source.

70. The apparatus of claim 68 wherein said power source operates in conjunction with an RF magnetron energy source.

71. The apparatus of claim 68 wherein said power source operates in conjunction with an RF diode energy source.

72. The apparatus according to claim 68 wherein the shutter mechanism comprises:

a shield having a hole, the hole corresponding with the deposition configuration to allow deposition of the plural materials onto the substrate;

a shutter for covering the hole to block deposition of the plural materials onto the substrate and for exposing the hole to allow deposition of the plural materials; and a shutter indexing actuator associated with the shutter for moving the shutter to cover and expose the hole.

73. The apparatus according to claim 72 wherein the shutter indexing actuator comprises an electric motor actuator.

74. The apparatus according to claim 72 wherein the actuator comprises a pneumatic actuator.

75. The apparatus according to claim 72 further comprising:

a first target comprising a first material, the first target disposed in the vacuum chamber;

a second target comprising a second material, the second target disposed in the vacuum chamber;

a mechanical indexing mechanism associated with the indexing arm coupled to the substrate support chuck, the mechanical indexing mechanism for aligning the substrate with the first target and the second target based on a pre-specified process sequence.

76. An apparatus for formation of multi-layer material structures using physical-vapor deposition of plural materials onto a substrate according to a predetermined sequence, the apparatus comprising:

a single, contiguous vacuum chamber having a central axis;

plural targets disposed in the vacuum chamber in a circular configuration about the central axis, the targets forming a target plane, the targets having the plural materials, at least one power source associated with the targets for supporting physical-vapor deposition process;

first and second substrate support chucks disposed in a substrate plane in the vacuum chamber for holding first and second substrates, the substrate plane substantially parallel to the target plane;

first and second indexing arms coupled to the first and second substrate support chucks;

an electromagnet coupled to at least one of the substrate support chucks, the electromagnet for formation of a magnetic field in the substrate plane; and at least one indexing mechanism associated with the first and second indexing arms and substrate support chucks, the at least one indexing mechanism for rotating the first and second indexing arms, the substrate support chucks, and the electromagnet coupled to at least one of the substrate support chucks in the substrate plane to maintain each substrate support chuck in substantial alignment with one of the plural targets according to the predetermined sequence;

wherein the electromagnet may support deposition of magnetic materials onto the substrate at any of the plural targets.

77. The apparatus according to claim 76 wherein the indexing mechanism comprises:

an indexing arm disposed in the vacuum chamber, the indexing arm for rotating the first and second indexing substrate support chucks in the substrate plane, the indexing arm rotating the substrate support chucks in a circle about the central axis; and a motor associated with the indexing arm, the motor rotating the indexing arm to align the substrate support chucks with selected targets according to the predetermined sequence.

78. The apparatus according to claim 77 wherein the motor has a zero rotation home position and wherein each target is disposed in the vacuum chamber at a predetermined position relative to the zero rotation position, the motor rotating the substrate support chucks to each predetermined target position by rotating a predetermined angular rotation associated with each target position.

79. The apparatus according to claim 76 wherein the targets are coupled to the top lid of the vacuum chamber to support physical-vapor deposition in sputter-down mode.

80. A method for depositing first and second materials from first and second targets onto a substrate to form a multi-layer structure on the substrate, the structure having a first layer comprised of the first material and a second layer comprised of the second material, the method comprising the steps of:

disposing the first and second targets in a single, contiguous vacuum chamber;

maintaining the substrate in substantial alignment with the first target in the vacuum chamber;

depositing the first material onto the substrate;

moving the substrate, along with an electromagnet associated with the substrate, with a mechanical indexing mechanism to align with the second target;

applying a magnetic field proximate to the substrate with the electromagnet disposed in the vacuum chamber, the electromagnet for supporting deposition of a magnetic material layer; and depositing the second material onto the substrate, the vacuum chamber remaining contiguous during the deposition of the second material onto the substrate.

81. The method according to claim 80 wherein the depositing the second material step comprises the step of providing an equipment state according to a process recipe to establish a predetermined process state, the process state resulting in deposition of the material according to a predetermined wafer state.

82. The method according to claim 81 further comprising the steps of:

sensing the equipment state; and adjusting the equipment state parameters to achieve the process recipe.

83. The method according to claim 81 further comprising the steps of:

sensing the process state; and adjusting the equipment state parameters to achieve the predetermined process state.

84. The method according to claim 81 further comprising the steps of:

sensing the wafer state; and adjusting the equipment state to achieve the predetermined wafer state.

85. The method according to claim 80 further comprising the steps of:

sensing the results of said depositing the first material steps;

detecting failures in said depositing the first material steps; and canceling said depositing the second material step if a failure is detected.

86. The apparatus of claim 45 wherein said shutter indexing actuator operates in a dynamic oscillatory mode to perform mechanical chopping of the physical-vapor deposition process.

87. The method according to claim 65 wherein said depositing the first material step further comprises depositing the first material with mechanical chopping through oscillation indexing modulation of a shutter.

88. An apparatus for physical-vapor deposition of a multi-layer material structure onto a single substrate, the material structure having plural material layers deposited according to a predetermined sequence, each layer comprised of one of plural materials, the apparatus comprising:

a single, contiguous vacuum chamber;

plural targets disposed in the vacuum chamber, at least one target comprised of one of the plural materials;

at least one power source associated with the plural targets for supporting physical-vapor deposition;

a single substrate support chuck disposed in the vacuum chamber for supporting the single substrate;

a mechanical indexing mechanism that moves the substrate relative to the plural targets and maintains the single substrate in substantial alignment with any one of the targets to deposit the multi-layer material structure of the plural materials according to the predetermined sequence; and an electromagnet coupled to the substrate support chuck, the electromagnet for formation of a magnetic field in the substrate plane, the electromagnet moving along with the substrate relative to the plural targets such that the electromagnet may support deposition of magnetic materials onto the substrate at any of the plural targets.

89. The apparatus of claim 88, further comprising the vacuum chamber remaining contiguous during the deposition of each of the plural material layers onto the substrate.

90. The apparatus of claim 88, further comprising an up/down actuation mechanism in conjunction with the substrate support chuck for adjusting the spacing between the targets and the substrate.

91. The apparatus of claim 88, further comprising a shutter associated with the vacuum chamber, the shutter operational to block deposition when inserted between the substrate support chuck and a selected target, the shutter further operational to allow deposition when removed from between the substrate support chuck and the selected target.

92. A method for physical-vapor deposition of a multi-layer material structure onto a single substrate, the structure having at least a first layer comprised of a first material and a second layer comprised of a second material, the method comprising the steps of:

disposing a first stationary target in a single, contiguous vacuum chamber, the first target comprised of the first material;

disposing a second stationary target in the vacuum chamber, the second target comprised of the second material;

supporting the single substrate on a single substrate support chuck coupled to a mechanical indexing mechanism in the vacuum chamber;

maintaining the single substrate support chuck in substantial alignment with the first stationary target with the mechanical indexing mechanism;

depositing the first material from the first stationary target onto the single substrate by applying electrical power to the first target;

using the mechanical indexing mechanism to move the substrate support chuck, along with an electromagnet coupled to the substrate support chuck, from the first stationary target to the second stationary target;

maintaining the single substrate support chuck in substantial alignment with the second stationary target with the mechanical indexing mechanism;

applying a magnetic field proximate to the single substrate with the electromagnet coupled to the substrate support chuck in substantial alignment with the second stationary target, and depositing the second material from the second stationary target onto the single substrate by applying electrical power to the second target.

93. The method of claim 92, further comprising the vacuum chamber remaining contiguous during the deposition of each of the first and second material layers onto the substrate.

94. The method of claim 92, further comprising the step of adjusting the spacing between the substrate and the first target with an up/down actuating mechanism coupled to the indexing mechanism and the single substrate support chuck.

95. The method of claim 92, wherein said depositing the first material step further comprises:

aligning the single substrate support chuck with the first stationary target;

inserting a shutter between the first stationary target and the single substrate;

initiating deposition of the first material onto the shutter by applying an electrical power to the first stationary target;

removing the shutter to provide substrate-to-target view and to allow deposition of the first material to the single substrate; and inserting the shutter between the first stationary target and the single substrate to block deposition of the first material onto the single substrate.

* * * * *